(12) United States Patent
Ishigaki et al.

(10) Patent No.: US 8,043,727 B2
(45) Date of Patent: Oct. 25, 2011

(54) ELECTROMAGNETIC WAVE-ABSORPTION MULTILAYER SUBSTRATE

(75) Inventors: Isao Ishigaki, Fukushima-ken (JP); Hideo Komura, Tokyo (JP)

(73) Assignee: Alps Electric Co., Ltd., Tokyo (JP)

( * ) Notice: Subject to any disclaimer, the term of this patent is extended or adjusted under 35 U.S.C. 154(b) by 120 days.

(21) Appl. No.: 12/103,463

(22) Filed: Apr. 15, 2008

(65) Prior Publication Data

US 2008/0268207 A1 Oct. 30, 2008

(30) Foreign Application Priority Data

Apr. 25, 2007 (JP) .................. 2007-115654

(51) Int. Cl.
*B32B 15/04* (2006.01)

(52) U.S. Cl. .................. 428/693.1; 428/692.1
(58) Field of Classification Search .......... None
See application file for complete search history.

(56) References Cited

U.S. PATENT DOCUMENTS

| 5,872,534 A | * | 2/1999 | Mayer ................. 342/1 |
| 2004/0012935 A1 | | 1/2004 | Tagi et al. |

FOREIGN PATENT DOCUMENTS

| JP | 2004-221522 | | 8/2004 | |
| KR | 2001-0093434 | * | 10/2001 | ........... 428/693.1 |

OTHER PUBLICATIONS

Machine translation of Harakawa et al. JP 2002026570A published Jan. 25, 2002.*
Machine translation of Naito Yutaka Korea 2004-221522 published May 8, 2004.*
Machine translation of Jeong et al. KR2001-0093434 published Oct. 29, 2001.*

* cited by examiner

*Primary Examiner* — Mark Ruthkosky
*Assistant Examiner* — Gary Harris
(74) *Attorney, Agent, or Firm* — Beyer Law Group LLP

(57) ABSTRACT

An electromagnetic wave-absorption multilayer substrate has an electromagnetic wave-absorption sheet which includes a soft magnetic alloy powder and a binding agent and two insulating substrates which have facing surfaces facing the electromagnetic wave-absorption sheet and which are pressure-bonded thereto. In addition, one of the insulating substrates has a plurality of holes formed in the facing surface.

9 Claims, 11 Drawing Sheets

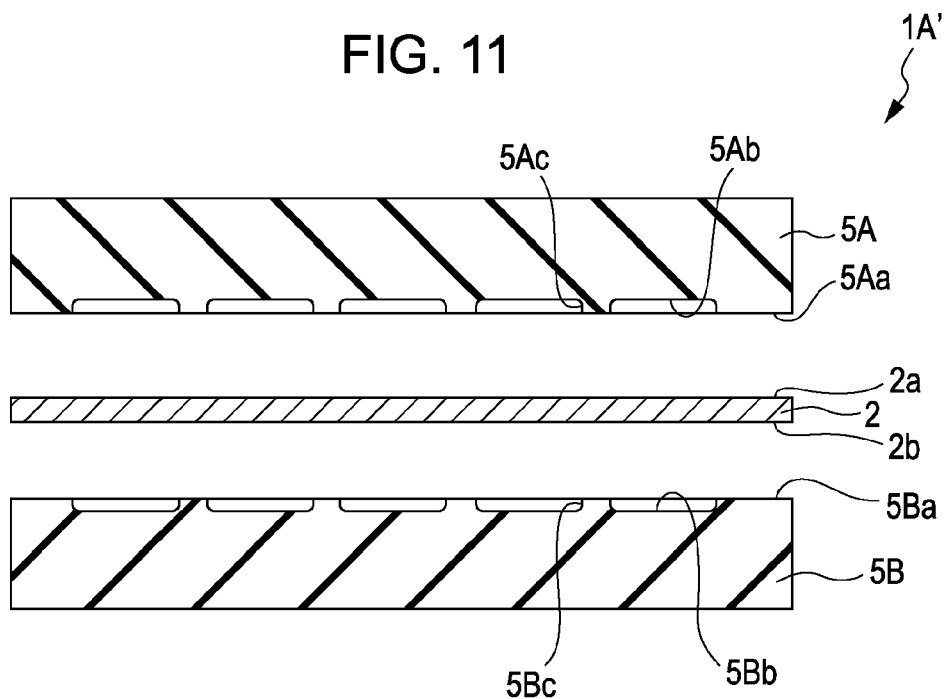
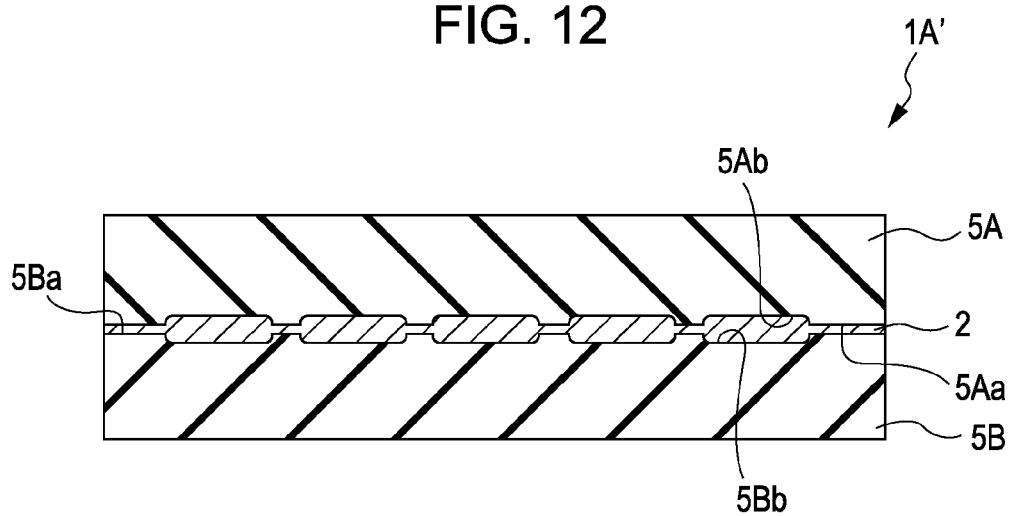

US 8,043,727 B2

ELECTROMAGNETIC WAVE-ABSORPTION MULTILAYER SUBSTRATE

CLAIM OF PRIORITY

This application claims benefit of the Japanese Patent Application No. 2007-115654 filed on Apr. 25, 2007, which is hereby incorporated by reference.

BACKGROUND OF THE INVENTION

1. Field of the Invention

The present invention relates to electromagnetic wave-absorption multilayer substrates, and more particularly relates to an electromagnetic wave-absorption multilayer substrate preferably used for an electronic circuit incorporated in an electronic apparatus, such as a mobile phone or an audio visual (AV) apparatus, which is necessary to have anti-noise measurements.

2. Description of the Related Art

In a high-frequency electronic apparatus, such as a mobile phone or a wireless apparatus, in order to suppress leakage of a high-frequency noise generated from an electronic circuit, such as a flexible wiring board or an integrated circuit (IC), and/or in order to prevent a high-frequency noise leaked from an exterior circuit, which is provided outside the high-frequency electronic apparatus, from entering an electronic circuit incorporated therein, an electromagnetic wave-absorption multilayer substrate is generally adhered to the electronic circuit.

As shown in FIG. 17, a related electromagnetic wave-absorption multilayer substrate 101 is formed by fixing two insulating substrates 105A and 105B on a front surface 102a and a rear surface 102b, respectively, of an electromagnetic wave-absorption sheet 102. As the insulating substrates 105A and 105B, pre-impregnated sheet material (hereinafter referred to as "prepreg(s)") have been frequently used in order to obtain superior adhesion to the electromagnetic wave-absorption sheet 102 as well as in order to improve the insulating properties and the protection properties. As the electromagnetic wave-absorption sheet 102, as shown in FIG. 18, a sheet-shaped part has been used which includes a soft magnetic alloy powder 103 and a binding agent 104. As this soft magnetic alloy, a high-permeability material, such as Sendust, permalloy, Ni—Zn ferrite, or Li-ferrite, has been used in many cases; however, in recent year, a Fe-based metal glass alloy having superior magnetic properties has been used.

When a metal glass alloy is used for the electromagnetic wave-absorption sheet 102, after the metal glass alloy is formed into flat particles which are used as the soft magnetic alloy powder 103 and is then mixed with the binding agent 104, such as a silicone resin or poly(vinyl chloride), the mixture thus obtained is formed into a sheet by a doctor blade method, followed by thermal pressure application, so that the electromagnetic wave-absorption sheet 102 is formed. The electromagnetic wave-absorption sheet 102 composed of a metal glass alloy in the form of flat particles can be formed to have a small thickness by the thermal pressure application, and the density of the metal glass alloy can also be increased; hence, compared to an electromagnetic wave-absorption sheet (not shown in the figure) formed of a different type of soft magnetic alloy powder, an electromagnetic wave suppressing effect can be improved.

SUMMARY OF THE INVENTION

However, when the electromagnetic wave-absorption multilayer substrate 101 is formed of the electromagnetic wave-absorption sheet 102 and the insulating substrates 105A and 105B provided thereon by thermal pressure bonding, the binding agent 104 of the electromagnetic wave-absorption sheet 102 is softened by the influence of the thermal pressure bonding, as shown in FIGS. 19 and 20, and as a result, the electromagnetic wave-absorption sheet 102 is compressed. The imaginary permeability $\mu''$ of the electromagnetic wave-absorption sheet 102 using a metal glass alloy tends to decrease as the metal glass alloy in the form of flat particles is compressed; hence, the electromagnetic wave-absorption rate of the electromagnetic wave-absorption multilayer substrate 101 thus formed disadvantageously decreases as compared to that of the electromagnetic wave-absorption sheet 102.

Accordingly, the present invention has been conceived in consideration of the situations described above, and the present invention provides an electromagnetic wave-absorption multilayer substrate in which, even when insulating substrates are pressure-bonded to an electromagnetic wave-absorption sheet, the electromagnetic wave-absorption rate thereof before it is incorporated in the electromagnetic wave-absorption multilayer substrate can be maintained.

To this end, in accordance with a first aspect of the present invention, there is provided an electromagnetic wave-absorption multilayer substrate comprising: an electromagnetic wave-absorption sheet which includes a soft magnetic alloy powder and a binding agent and which has a sheet shape; and two insulating substrates which have facing surfaces facing the electromagnetic wave-absorption sheet and which sandwich the electromagnetic wave-absorption sheet and are pressure-bonded thereto, wherein at least one of the two insulating substrates has at least one hole formed in the facing surface or at least one protrusion formed thereon.

According to the electromagnetic wave-absorption multilayer substrate of the first aspect of the present invention, when the insulating substrates are pressure-bonded, since a hole corresponding portion or a non-protrusion corresponding portion of the electromagnetic wave-absorption sheet is not easily compressed as compared to the other portion, a decrease in the electromagnetic wave-absorption rate of the electromagnetic wave-absorption sheet can be prevented.

In accordance with a second aspect of the present invention, there is provided an electromagnetic wave-absorption multilayer substrate comprising: an electromagnetic wave-absorption sheet which includes a soft magnetic alloy powder and a binding agent and which has a sheet shape; two insulating substrates which sandwich the electromagnetic wave-absorption sheet and are pressure-bonded thereto; and a sheet-shaped spacer which has at least one penetrating hole and which is provided between one of the insulating substrates and the electromagnetic wave-absorption sheet so that the penetrating hole faces thereto.

According to the electromagnetic wave-absorption multilayer substrate of the second aspect of the present invention, when the insulating substrates are pressure-bonded, since a penetrating-hole corresponding portion of the electromagnetic wave-absorption sheet is not easily compressed as compared to the other portion, a decrease in the electromagnetic wave-absorption rate of the electromagnetic wave-absorption sheet can be prevented.

As a third aspect of the present invention, in the electromagnetic wave-absorption multilayer substrate according to the first or the second aspect, the number of the holes or the protrusions or the number of the penetrating holes is preferably at least two.

According to the electromagnetic wave-absorption multilayer substrate of the third aspect of the present invention, since the hole or the protrusion or the penetrating hole functions as an anti-slipping element for the electromagnetic wave-absorption sheet, when the insulating substrates are pressure-bonded, the insulating substrates or the spacer is prevented from slipping in a direction perpendicular to the compression direction.

As a fourth aspect of the present invention, in the electromagnetic wave-absorption multilayer substrate according to one of the first to the third aspects, the holes or the protrusions or the penetrating holes are preferably disposed at regular intervals.

According to the electromagnetic wave-absorption multilayer substrate of the fourth aspect of the present invention, since wall portions formed between the holes in the insulating substrate or between the penetrating holes in the spacer or the protrusions of the insulating substrate are disposed at regular intervals so as to function as support portions between the facing surfaces, an anti-compression strength of the electromagnetic wave-absorption multilayer substrate can be improved in thermal pressure application by the insulating substrates.

As a fifth aspect of the present invention, in the electromagnetic wave-absorption multilayer substrate according to one of the first to the fourth aspects, the hole or the protrusion or the penetrating hole preferably has a rectangular shape or a linear wall shape.

According to the electromagnetic wave-absorption multilayer substrate of the fifth aspect of the present invention, since the holes or the protrusions or the penetrating holes are easily formed at regular intervals, the number of the holes or the protrusions or that of the penetrating holes can be easily increased.

As a sixth aspect of the present invention, in the electromagnetic wave-absorption multilayer substrate according to one of the first to the fifth aspects, the holes or the protrusions or the penetrating holes are preferably disposed in a lattice shape or a staggered lattice shape.

According to the electromagnetic wave-absorption multilayer substrate of the sixth aspect of the present invention, as the number of the holes or the protrusions or the number of the penetrating holes is increased, the anti-compression strength of the electromagnetic wave-absorption multilayer substrate can be improved in thermal pressure application.

As a seventh aspect of the present invention, in the electromagnetic wave-absorption multilayer substrate according to one of the first to the sixth aspects, the insulating substrates and/or the spacer are preferably formed of prepregs and are preferably thermal pressure-bonded to the electromagnetic wave-absorption sheet.

According to the electromagnetic wave-absorption multilayer substrate of the seventh aspect of the present invention, since the prepregs have superior insulating and adhesion properties, when the electromagnetic wave-absorption multilayer substrate is adhered to a wiring board, it can be easily adhered to the wiring board while the electromagnetic wave-absorption sheet is insulated from a conductive member formed on the wiring board. In addition, when the prepregs are used for the spacer, the spacer is prevented from being displaced from the electromagnetic wave-absorption sheet.

As an eighth aspect of the present invention, in the electromagnetic wave-absorption multilayer substrate according to one of the first to the seventh aspects, the hole or the protrusion or the penetrating hole is preferably formed by press machining.

According to the electromagnetic wave-absorption multilayer substrate of the eighth aspect of the present invention, since the hole or the protrusion of the insulating substrate or the penetrating hole of the spacer can be formed by performing a press machining step only once, the hole or the protrusion or the penetrating hole can be easily formed.

As a ninth aspect of the present invention, in the electromagnetic wave-absorption multilayer substrate according to one of the first to the eighth aspects, the soft magnetic alloy powder preferably comprises a metal glass alloy containing an amorphous phase as a primary phase.

According to the electromagnetic wave-absorption multilayer substrate of the ninth aspect of the present invention, since the permeability of the electromagnetic wave-absorption sheet increases, and at the same time, since the magnetic loss thereof decreases, the electromagnetic wave suppressing effect can be improved.

As a tenth aspect of the present invention, in the electromagnetic wave-absorption multilayer substrate according to one of the first to the ninth aspects, the hole or the protrusion or the penetrating hole is preferably formed to have a hole depth or a protrusion length of 25 to 440 μm or a penetrating hole length of 25 to 440 μm.

It has been known that when the electromagnetic wave-absorption sheet has a thickness of 25 to 440 μm before the thermal pressure application, an imaginary permeability (magnetic loss) of 10 or more can be obtained; hence, in the tenth aspect of the present invention, by using the above feature, since the hole or the protrusion or the penetrating hole is formed to have a hole depth or a protrusion length of 25 to 440 μm or a penetrating length of 25 to 440 μm, the imaginary permeability of the electromagnetic wave-absorption multilayer substrate can be made 10 or more.

According to the electromagnetic wave-absorption multilayer substrate of the present invention, since a decrease in the electromagnetic wave-absorption is prevented by partly preventing the compression of the electromagnetic wave-absorption sheet, even when the insulating substrates are pressure-bonded to the electromagnetic wave-absorption sheet, an effect can be obtained in which the electromagnetic wave-absorption rate of the electromagnetic wave-absorption sheet before it is incorporated in the electromagnetic wave-absorption multilayer substrate can be maintained.

BRIEF DESCRIPTION OF THE DRAWINGS

FIG. 11 is an exploded vertical cross-sectional view showing an electromagnetic wave-absorption multilayer substrate according to another embodiment in which holes are formed in each facing surface;

FIG. 12 is a vertical cross-sectional view showing the electromagnetic wave-absorption multilayer substrate according to said another embodiment in which the holes are formed in each facing surface;

DESCRIPTION OF THE PREFERRED EMBODIMENTS

Hereinafter, with reference to FIGS. 1 to 14, electromagnetic wave-absorption multilayer substrates of a first and a second embodiment of the present invention will be described.

Figure 1:
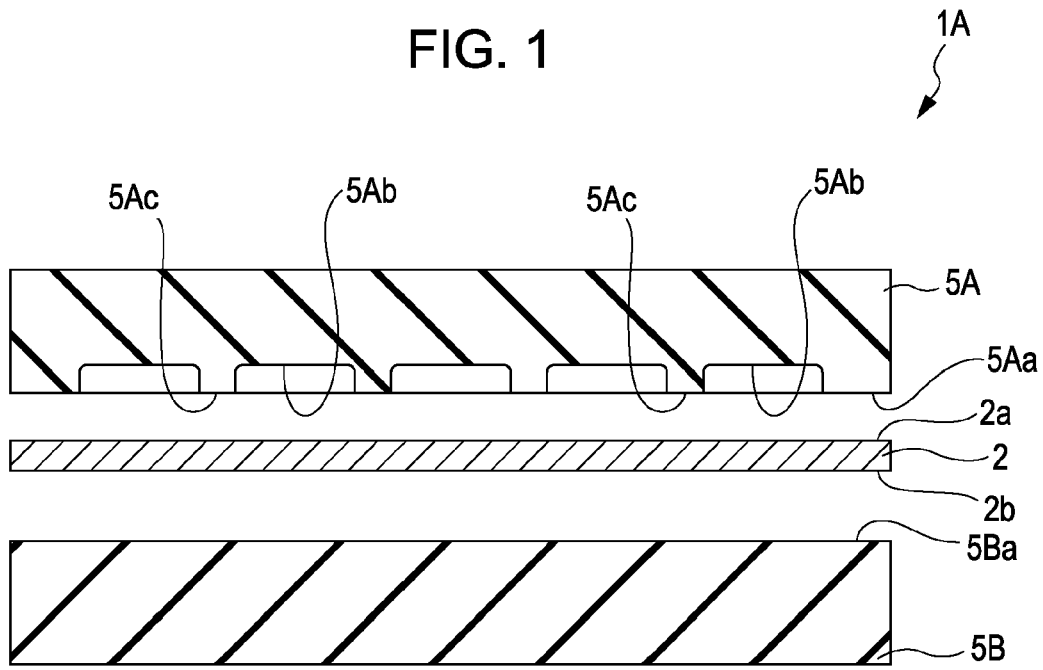
FIG. 1 is an exploded vertical cross-sectional view of an electromagnetic wave-absorption multilayer substrate according to a first embodiment.
Figure 2:
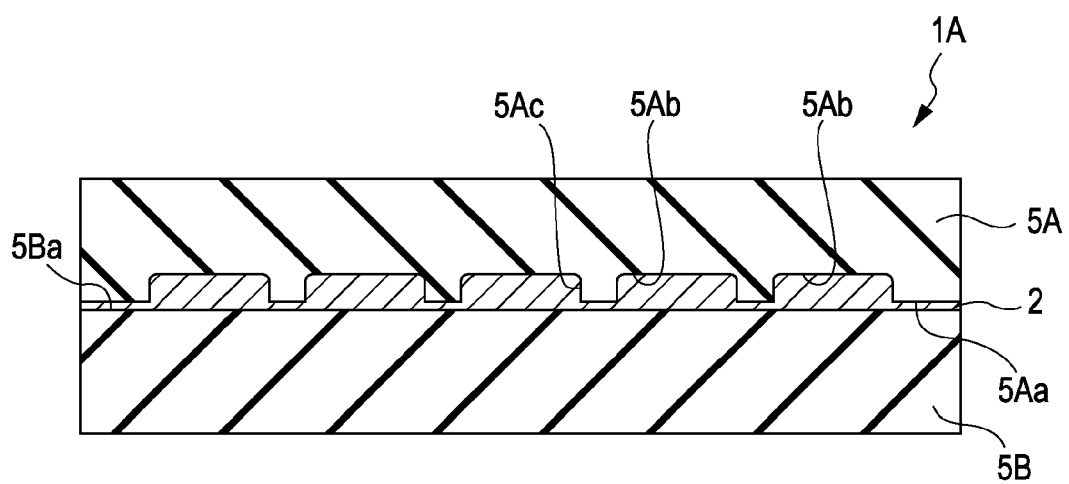
FIG. 2 is a vertical cross-sectional view of the electromagnetic wave-absorption multilayer substrate according to the first embodiment.
Figure 3:
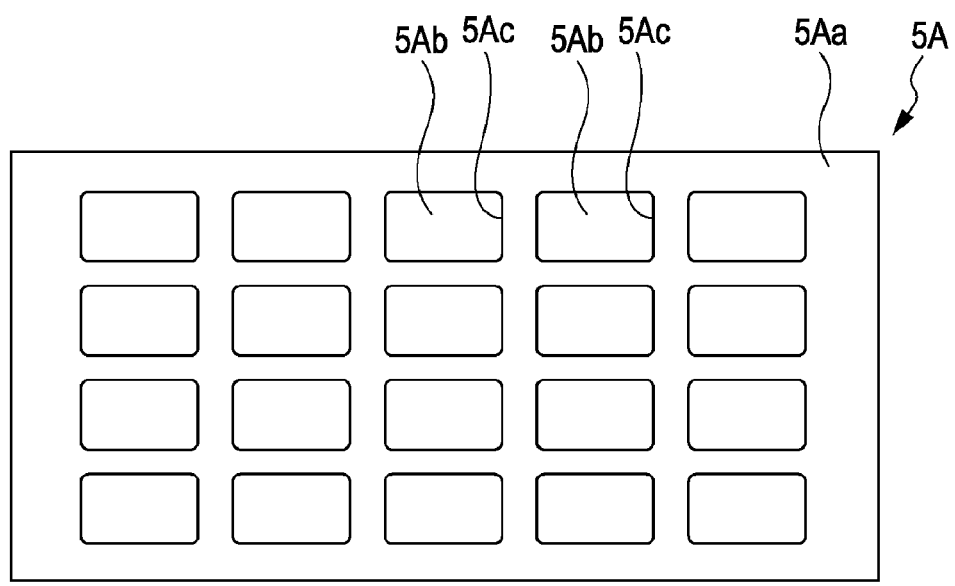
FIG. 3 is a plan view showing a facing surface of one of two insulating substrates, the facing surface having holes formed therein, according to the first embodiment.

FIGS. 1 to 3 show an electromagnetic wave-absorption multilayer substrate 1A of the first embodiment. The electromagnetic wave-absorption multilayer substrate 1A of the first embodiment has an electromagnetic wave-absorption sheet 2 and two insulating substrates 5A and 5B, as shown in FIG. 1.

Figure 9:
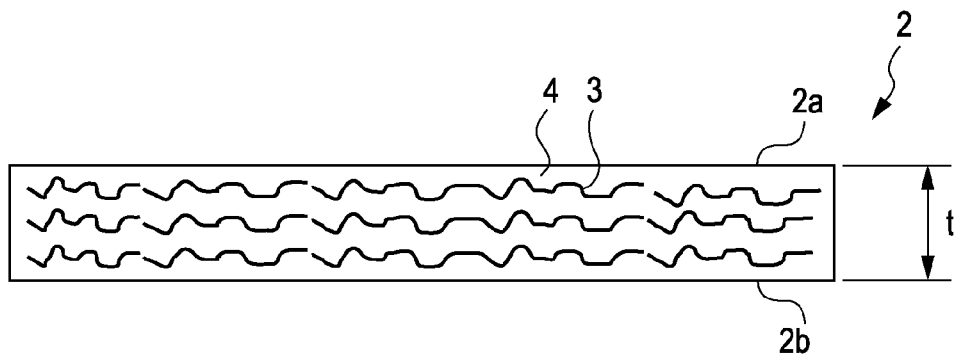
FIG. 9 is a cross-sectional view showing an electromagnetic wave-absorption sheet according to the first embodiment, which is in the state before the insulating substrates are thermal pressure-bonded.

As shown in FIG. 9, the electromagnetic wave-absorption sheet 2 is obtained by forming a mixture of a soft magnetic alloy powder 3 and a binding agent 4 into a sheet by a doctor blade method or by spraying the soft magnetic alloy powder 3 to the binding agent 4 to form a sheet, followed by thermal pressure application. A plurality of sheets are preferably laminated to each other to form the electromagnetic wave-absorption sheet 2. The reason for this is that when the sheets are laminated to each other, surface defects and internal voids of the sheets are repaired therebetween, and as a result, electromagnetic wave-absorption properties can be improved while the density of the soft magnetic alloy powder 3 is increased.

As the soft magnetic alloy powder 3, a metal glass alloy containing an amorphous phase as a primary phase, in particular, a Fe-based metal glass alloy, is preferably used. As the composition of the Fe-based metal glass alloy, for example, $Fe_{100-x-y-z-w-t}M_xP_yC_zB_wSi_t$ (M is at least one element selected from the group consisting of Cr, Mo, W, V, Nb, Ta, Ti, Zr, Hf, Pt, Pd, or Au) may be used. In addition, x, y, z, w, and t showing the composition ratios satisfy the following equations: 0.5 atomic percent $\leq x \leq 8$ atomic percent, 2 atomic percent $\leq y \leq 15$ atomic percent, 0 atomic percent $\leq z \leq 8$ atomic percent, 1 atomic percent $\leq w \leq 12$ atomic percent, 0 atomic percent $\leq t \leq 8$ atomic percent, and 70 atomic percent $\leq (100-x-y-z-w-t) \leq 79$ atomic percent. In addition, as another example, a Fe—Al—Ga—C—P—Si—B-based alloy or a metal glass alloy having a composition other than the Fe-based composition, which have been used heretofore, may also be used.

When a metal glass alloy is used for the soft magnetic alloy powder 3, first, by pulverizing a thin alloy sheet obtained by rapidly cooling a molten metal glass alloy having a desired composition using a liquid quenching method or by mechanically pulverizing, using an attritor, spherical particles obtained using a water atomizing method or a gas atomizing method, so that a metal glass alloy in the form of flat particles is obtained. The obtained metal glass alloy is preferably processed, whenever necessary, by a heat treatment in order to reduce an internal stress generated therein. A heat treatment temperature Ta is preferably in the range of the Curie temperature to a glass transition temperature Tg.

The aspect ratio (major axis/thickness) of this flat particle (not shown) is preferably 2.5 or more and more preferably 12 or more. When the aspect ratio of the flat particle is 2.5 or more, the imaginary permeability μ" of the electromagnetic wave-absorption sheet 2 is 10 or more. In addition, when the aspect ratio of the flat particle is 12 or more, the imaginary permeability μ" of the electromagnetic wave-absorption sheet 2 is 15 or more. In addition, as the aspect ratio of the flat particle is higher, the flat particles are oriented when the electromagnetic wave-absorption sheet 2 is formed by compression, and the imaginary permeability μ" in a GHz band increases; hence, the electromagnetic wave-absorption properties are improved. However, in consideration of the present manufacturing technique, the upper limit of the aspect ratio is approximately 250.

In addition, as the Fe-based metal glass alloy, a substance that satisfies the equation, $\Delta Tx = Tx - Tg > 25K$ ($\Delta Tx$: temperature difference of a supercooled liquid, Tx: crystallization starting temperature, and Tg: glass transition temperature), is preferably used. According to a Fe-based metal glass alloy that satisfies the above equation, the soft magnetic properties are superior, the imaginary permeability of the electromagnetic wave-absorption sheet 2 is 10 or more or 15 or more depending on conditions, the electromagnetic wave suppressing effect in a GHz band is improved, and a high-frequency electromagnetic wave is effectively shielded.

As the binding agent 4, a heat resistant resin, such as a silicone resin, or a thermoplastic resin, such as poly(vinyl chloride), is preferably used. In addition, besides the soft magnetic alloy powder 3 and/or the binding agent 4, a dispersing medium, such as xylene, toluene, or isopropyl alcohol, and/or a lubricant agent, such as a stearate, may be added to the electromagnetic wave-absorption sheet 2.

As the content of the soft magnetic alloy powder 3 in the electromagnetic wave-absorption sheet 2, when a metal glass alloy is used as the soft magnetic alloy powder 3, the content in the range of 41 to 83 volume percent is preferable. When the content of the soft magnetic alloy powder 3 is 41 volume percent or more, since the imaginary permeability μ" of the electromagnetic wave-absorption sheet 2 is 10 or more, the electromagnetic wave suppressing effect can be effectively obtained. In addition, when the content is 83 volume percent or less, since particles of the soft magnetic alloy powder 3, which are located adjacent to each other, are not in direct contact with each other, a decrease in impedance of the electromagnetic wave-absorption sheet 2 can be effectively prevented.

A thickness t of the electromagnetic wave-absorption sheet 2 is preferably set in the range of 25 to 440 μm before the electromagnetic wave-absorption sheet 2 is processed by thermal pressure application. When the thickness t of the electromagnetic wave-absorption sheet 2 before the thermal pressure application is in the range of 25 to 440 μm, the imaginary permeability μ" of the electromagnetic wave-absorption sheet 2 is 10 or more. In addition, when the thickness t of the electromagnetic wave-absorption sheet 2 before the thermal pressure application is in the range of 55 to 400 μm, the imaginary permeability μ" is 15 or more.

The insulating substrates 5A and 5B of the electromagnetic wave-absorption multilayer substrate 1A are each formed using a heat resistant resin or prepregs to have a thin plate shape, as shown in FIG. 1. The two insulating substrates 5A and 5B have facing surfaces 5Aa and 5Ba facing the electromagnetic wave-absorption sheet 2 and are pressure-bonded to a front surface 2a and a rear surface 2b, respectively, of the electromagnetic wave-absorption sheet 2 so as to sandwich the electromagnetic wave-absorption sheet 2. When the two insulating substrates 5A and 5B are formed using prepregs, the two insulating substrates 5A and 5B are thermal pressure-bonded to the electromagnetic wave-absorption sheet 2 under thermal pressure application conditions of a temperature of 170° C. and a pressure of 40 to 50 kg/cm2.

Figure 4:
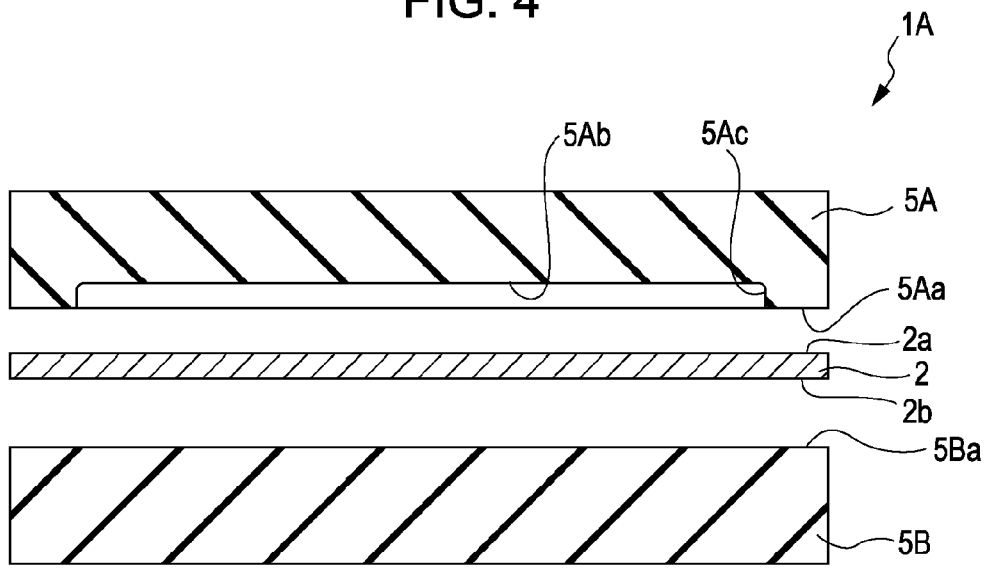
FIG. 4 is an exploded vertical cross-sectional view showing an electromagnetic wave-absorption multilayer substrate in which one hole is formed in a facing surface of an insulating substrate.
Figure 5:
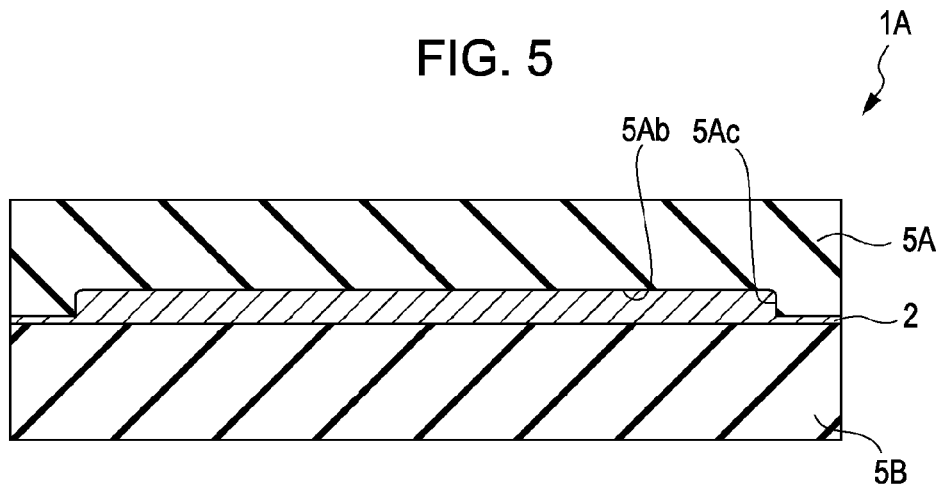
FIG. 5 is a vertical cross-sectional view showing the electromagnetic wave-absorption multilayer substrate in which one hole is formed in the facing surface of the insulating substrate.
Figure 6:
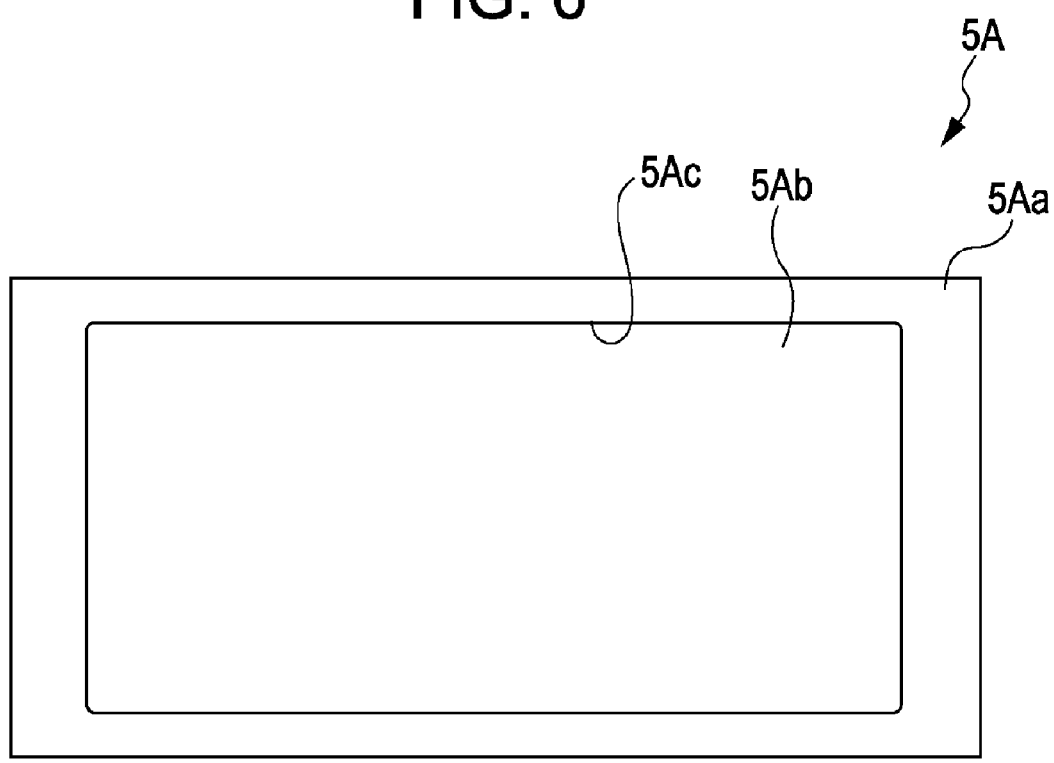
FIG. 6 is a plan view showing the facing surface having one hole of the insulating substrate.

In the two insulating substrates 5A and 5B of the first embodiment, as shown in FIGS. 1 to 3, at least one insulating substrate (upper insulating substrate in the first embodiment) 5A has holes 5Ab in the facing surface 5Aa. A larger total opening area of the holes 5Ab is more preferable. The number of the holes 5Ab may be either one as shown in FIGS. 4 to 6 or at least two as shown in FIG. 3, 7, or 8; however, the number is preferably at least two and is more preferably increased as large as possible.

Figure 7:
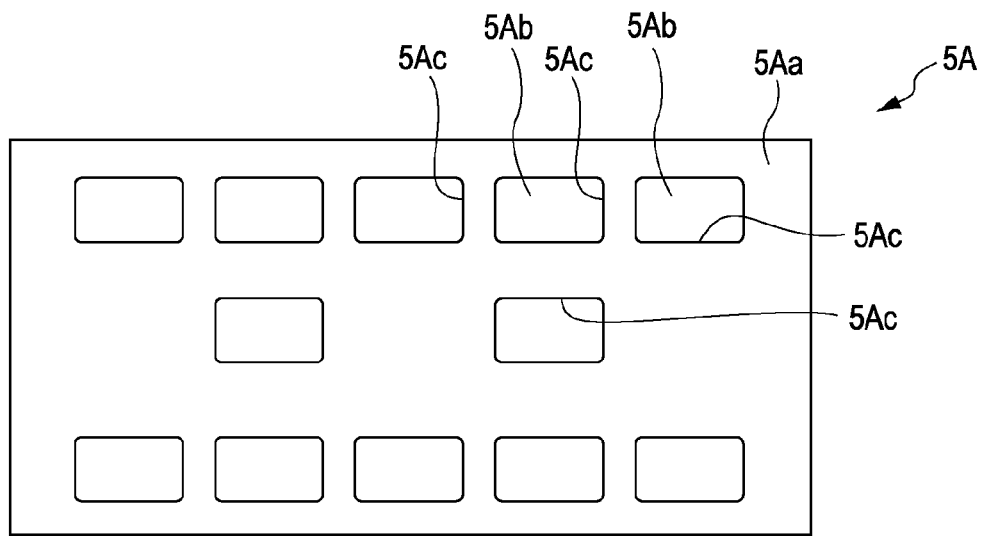
FIG. 7 is a plan view showing a facing surface of an insulating substrate, in which holes are formed at regular intervals.
Figure 8:
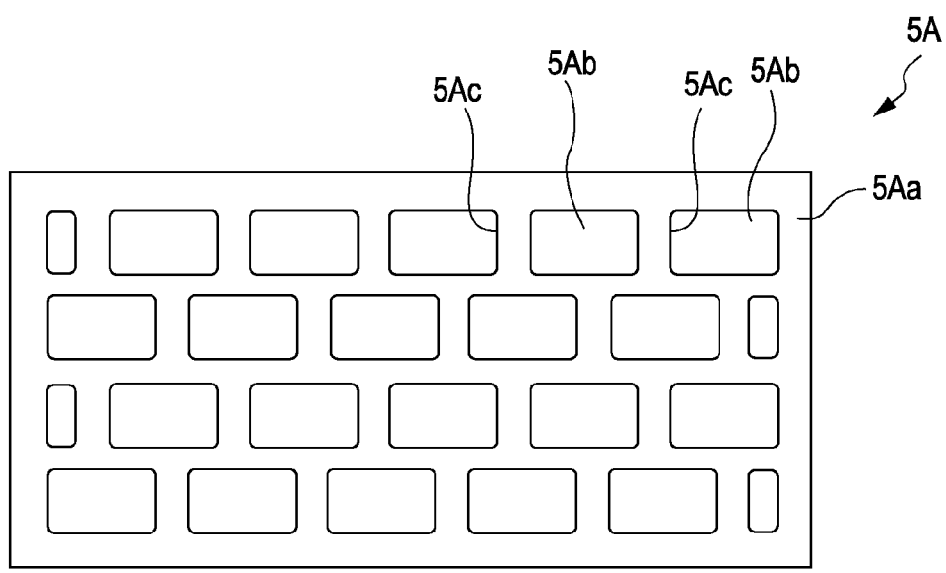
FIG. 8 is a plan view showing a facing surface of an insulating substrate, in which holes are disposed in a staggered lattice shape.

In addition, as shown in FIG. 3, 7, or 8, the holes 5Ab are preferably disposed at regular intervals and, in particular as shown in FIG. 3 or 8, are preferably disposed in a lattice shape or a staggered lattice shape. In the first embodiment, the lattice arrangement shown in FIG. 3 is used.

In addition, the hole 5Ab may have a circular shape (not shown) or a triangle shape (not shown); however, as shown in FIG. 3, the hole 5Ab preferably has a triangle shape. The holes 5Ab may be formed by any method; however, when the simplification of the process is taken into consideration, one-shot press machining is preferably used. The holes 5Ab preferably have a depth of 25 to 440 μm, and in order to decrease the thickness of the electromagnetic wave-absorption multilayer substrate 1A and to improve the imaginary permeability μ" thereof, a depth in the range of 50 to 80 μm is preferably formed.

Next, with reference to the figures, the effect of the electromagnetic wave-absorption multilayer substrate 1A of the first embodiment will be described.

In the electromagnetic wave-absorption multilayer substrate 1A of the first embodiment, as shown in FIG. 1, a metal glass alloy containing an amorphous phase as a primary phase is used for the soft magnetic alloy powder 3 of the electromagnetic wave-absorption sheet 2. Hence, as the permeability of the electromagnetic wave-absorption sheet 2 increases, the magnetic loss decreases, thereby improving the electromagnetic wave suppressing effect. When the Fe-based metal glass alloy described above is selected among metal glass alloys, the electromagnetic wave suppressing effect can be further improved.

In addition, in the first embodiment, the two insulating substrates 5A and 5B to be pressure-bonded to the electromagnetic wave-absorption sheet 2 are formed of prepregs. Since the insulating properties and the adhesion properties of the prepregs are superior, when the electromagnetic wave-absorption multilayer substrate is adhered to a wiring board, it can be easily adhered to the wiring board while the electromagnetic wave-absorption sheet 2 is insulated from a conductive member formed on the wiring board.

Figure 17:
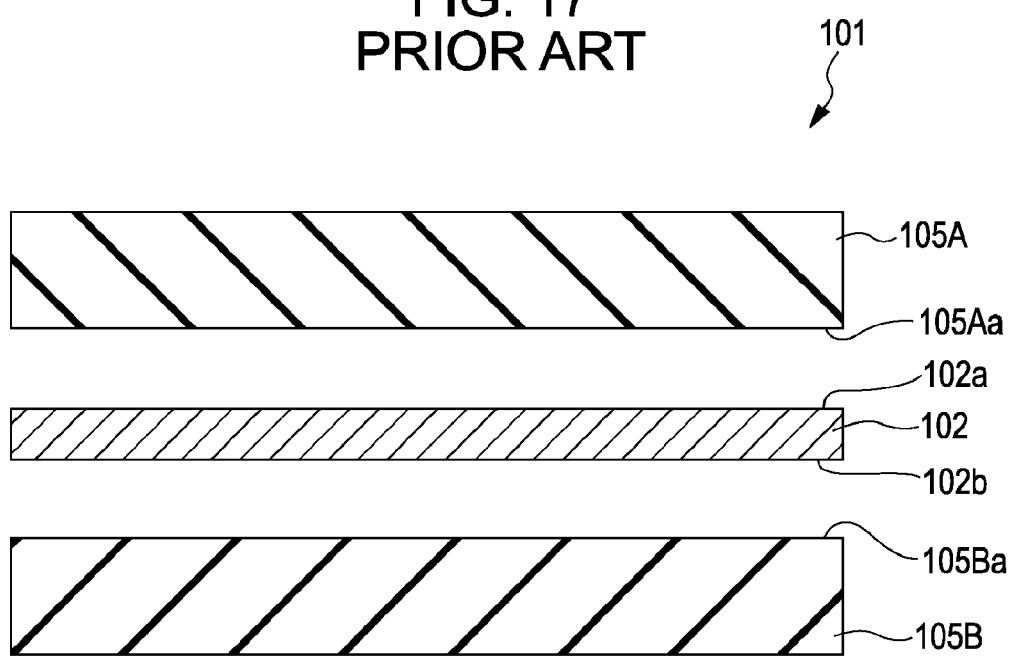
FIG. 17 is an exploded vertical cross-sectional view showing one example of a related electromagnetic wave-absorption multilayer substrate.
Figure 18:
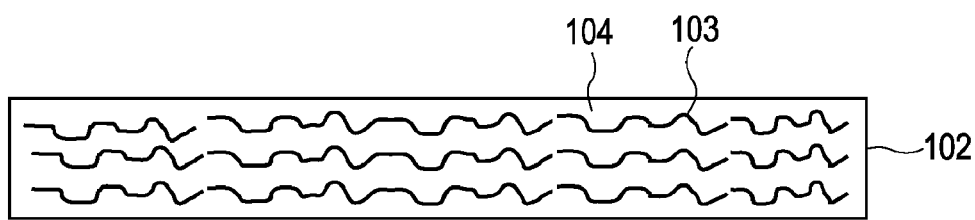
FIG. 18 is a cross-sectional view of an electromagnetic wave-absorption sheet of the related electromagnetic wave-absorption multilayer substrate, which is in the state before insulating substrates are thermal pressure-bonded.
Figure 19:
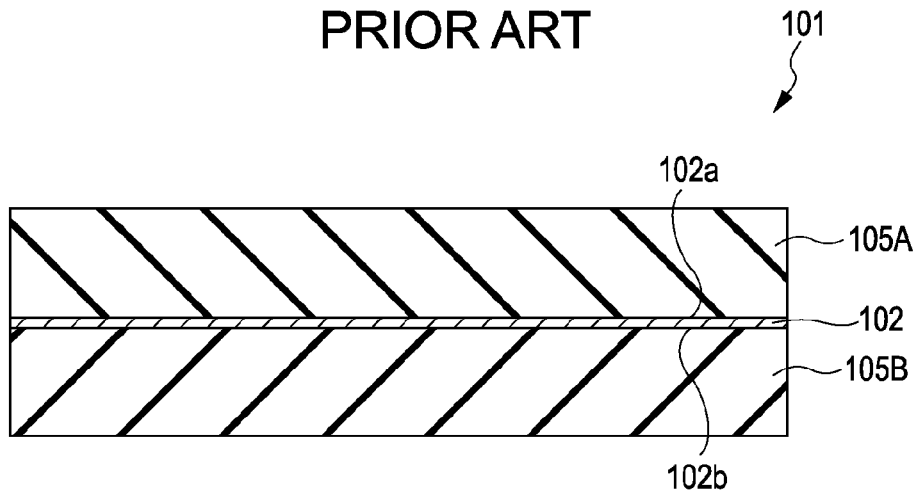
FIG. 19 is a vertical cross-sectional view showing one example of the related electromagnetic wave-absorption multilayer substrate.
Figure 20:
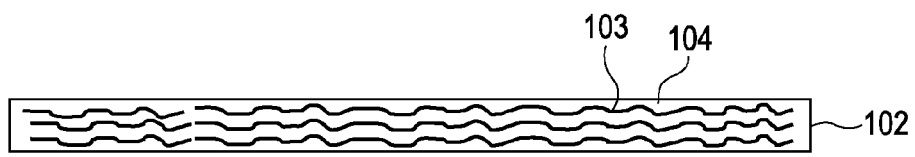
FIG. 20 is a cross-sectional view of the electromagnetic wave-absorption sheet of the related electromagnetic wave-absorption multilayer substrate, which is in the state after the insulating substrates are thermal pressure-bonded.

In addition, in the electromagnetic wave-absorption multilayer substrate 1A of the first embodiment, as shown in FIG. 2, the electromagnetic wave-absorption sheet 2 is formed so as to be sandwiched between the two insulating substrates 5A and 5B. These two insulating substrates 5A and 5B are thermal pressure-bonded to the front surface 2a and the rear surface 2b of the electromagnetic wave-absorption sheet 2, respectively. When the two insulating substrates 5A and 5B are thermal pressure-bonded, the binding agent 4 of the electromagnetic wave-absorption sheet 2 is softened by heat generated thereby. If the facing surfaces 5Aa and 5Ba of the two insulating substrates 5A and 5B are flat surfaces as facing surfaces of a related insulating substrates 105A and 105B (see FIG. 17), the electromagnetic wave-absorption sheet 2 is compressed as compared to that before the thermal pressure application (see FIG. 19). When the electromagnetic wave-absorption sheet 2 is compressed, since the distance between particles of the soft magnetic alloy powder 3, which is held constant in the electromagnetic wave-absorption sheet 2 by the binding agent, is decreased in the lamination direction, the inherent imaginary permeability μ" of the electromagnetic wave-absorption sheet 2 decreases, and as a result, the electromagnetic wave-absorption rate of the electromagnetic wave-absorption sheet 2 also decreases.

Figure 10:
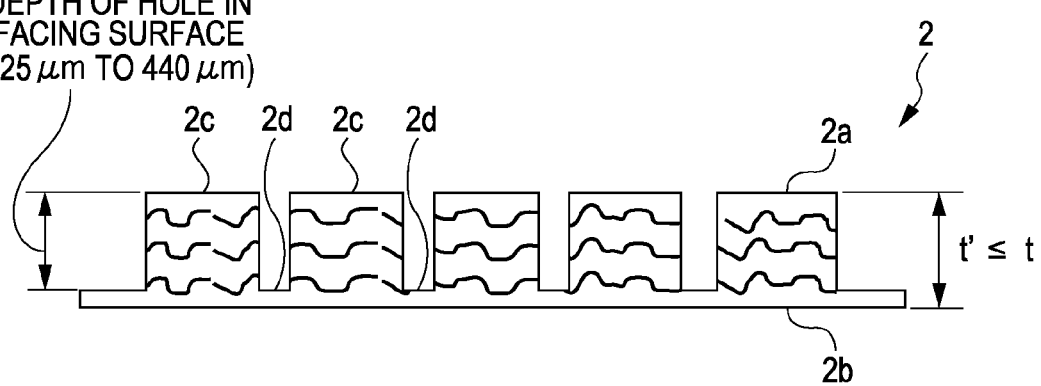
FIG. 10 is a cross-sectional view showing the electromagnetic wave-absorption sheet according to the first embodiment, which is in the state after the insulating substrates are thermal pressure-bonded.

Hence, in the first embodiment, as shown in FIG. 1, the holes 5Ab are provided in the facing surface 5Aa of the insulating substrate 5A, which is one of the two insulating substrates 5A and 5B. Accordingly, as shown in FIG. 2, even when the electromagnetic wave-absorption sheet 2 is compressed by pressure bonding of the insulating substrates 5A and 5B, hole corresponding portions 2c of the electromagnetic wave-absorption sheet 2 are not easily compressed, as shown in FIG. 10. At the hole corresponding portions 2c of the electromagnetic wave-absorption sheet 2, the distance between particles of the soft magnetic alloy powder 3, which is held constant in the electromagnetic wave-absorption sheet 2, is not decreased by compression in the lamination direction as compared to that of the other portions 2d, and in addition, the flat particles of the soft magnetic alloy powder 3 are not compressed nor deformed; hence, the properties of the electromagnetic wave-absorption sheet 2 are not changed, and the decrease in the electromagnetic wave-absorption rate thereof is prevented.

As shown in FIGS. 1 to 3, by forming a plurality of the holes 5Ab in the facing surface 5Aa, when the insulating substrates 5A and 5B are pressure-bonded, wall portions 5Ac formed between the holes 5Ab in the facing surface 5Aa are pushed into the electromagnetic wave-absorption sheet 2 so as to function as an anti-slipping element for the electromagnetic wave-absorption sheet 2; hence, the insulating substrates 5A and 5B are prevented from slipping in a direction perpendicular to the compression direction. In addition, as shown in FIGS. 4 to 6, when only one hole 5Ab is formed in the facing surface 5Aa, the area of the hole corresponding portion 2c of the electromagnetic wave-absorption sheet 2 can be maximized; however, the anti-compression strength of the electromagnetic wave-absorption multilayer substrate 1A varies from place to place in the thermal pressure application by the insulating substrates 5A and 5B. Hence, as shown in FIGS. 3, 7, and 8, when at least two holes 5Ab are formed in the facing surface 5Aa and are disposed at regular intervals, the wall portions 5Ac formed between the holes 5Ab function as support portions and are disposed at regular intervals, so that the anti-compression strength of the electromagnetic wave-absorption multilayer substrate 1A can be improved.

In addition, as shown in FIG. 3, when the holes 5Ab are formed to have a rectangular shape, since the holes 5Ab can be easily formed at regular intervals while the thickness of the wall portions 5Ac formed between the holes 5Ab is maintained constant, the anti-compression strength of the electromagnetic wave-absorption multilayer substrate 1A can be improved in the thermal pressure application by the insulating substrates 5A and 5B, and in addition, the number of the holes 5Ab can be easily increased. In this case, when the holes 5Ab as described above are disposed in a lattice shape as shown in FIG. 3 or in a staggered lattice shape as shown in FIG. 8, the wall portions 5Ac between the holes 5Ab are formed to have a predetermined thickness and are disposed at regular intervals, and at the same time, the holes 5Ab can be efficiently disposed; hence, as the number of the holes 5Ab is increased, the anti-compression strength of the electromagnetic wave-absorption multilayer substrate 1A can be improved.

In addition, in the first embodiment, the holes 5Ab are formed in the facing surface 5Aa by press machining. Although the holes 5Ab may not be easily formed in the facing surface 5Aa by another method in some cases, by the press machining, the holes 5Ab can be formed only by one step, and hence the formation thereof is easily performed. In addition, the depth of the holes 5Ab is set to 25 to 440 μm. It has been known that, when the electromagnetic wave-absorption sheet 2 has a thickness of 25 to 440 μm before the thermal pressure application, the imaginary permeability (magnetic loss) μ" is 10 or more. In addition, it has also been known that, when the thickness of the electromagnetic wave-absorption sheet 2 is in the range of 55 to 400 μm before the thermal pressure application, the imaginary permeability μ" is 15 or more.

That is, by using the above-described feature, when the depth of the hole 5Ab is set to satisfy that the distance between the insulating substrates 5A and 5B is at least in the range of 25 to 440 μm, the imaginary permeability μ" of the electromagnetic wave-absorption multilayer substrate 1A can be made at least 10 or more. However, when the depth of the hole 5Ab is increased, the thickness of the insulating substrate 5A must be increased corresponding to the increase of the depth. Hence, when the depth of the hole 5Ab is set to approximately 50 to 80 μm, the thickness of the insulating substrate 5A can be decreased in an amount corresponding to the depth as described above; hence, a decrease in the thickness and an improvement in the imaginary permeability μ" of the electromagnetic wave-absorption multilayer substrate 1A can be simultaneously achieved.

In the first embodiment, although the holes 5Ab are formed only in the facing surface 5Aa of the insulating substrate 5A, which is one of the insulating substrates 5A and 5B, according to an electromagnetic wave-absorption multilayer substrate 1A' of another embodiment, as shown in FIGS. 11 and 12, holes 5Ab and 5Bb may be formed in the facing surfaces 5Aa and 5Ba of the two insulating substrates 5A and 5B, respectively.

Figure 13:
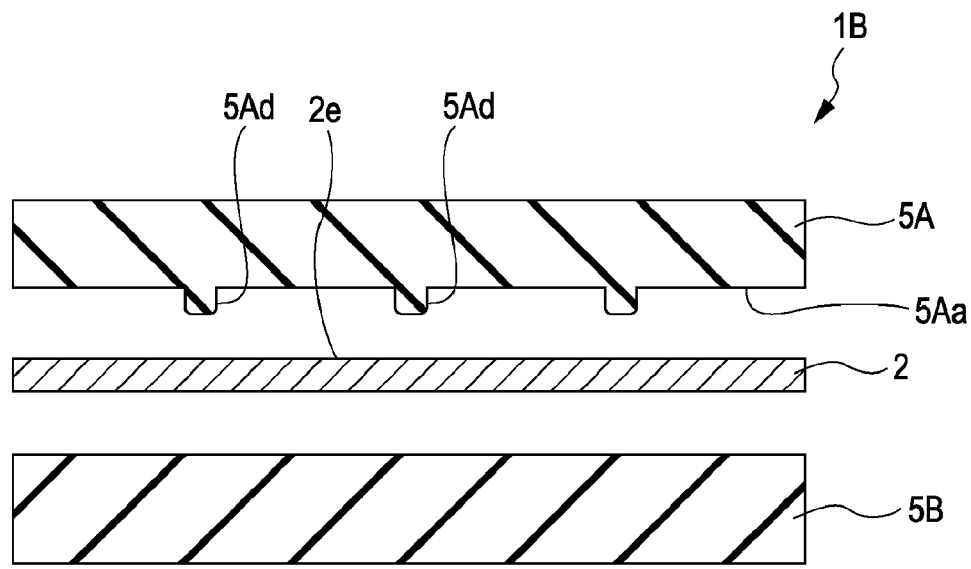
FIG. 13 is an exploded vertical cross-sectional view showing an electromagnetic wave-absorption multilayer substrate according to another embodiment in which protrusions are formed on one facing surface.
Figure 14:
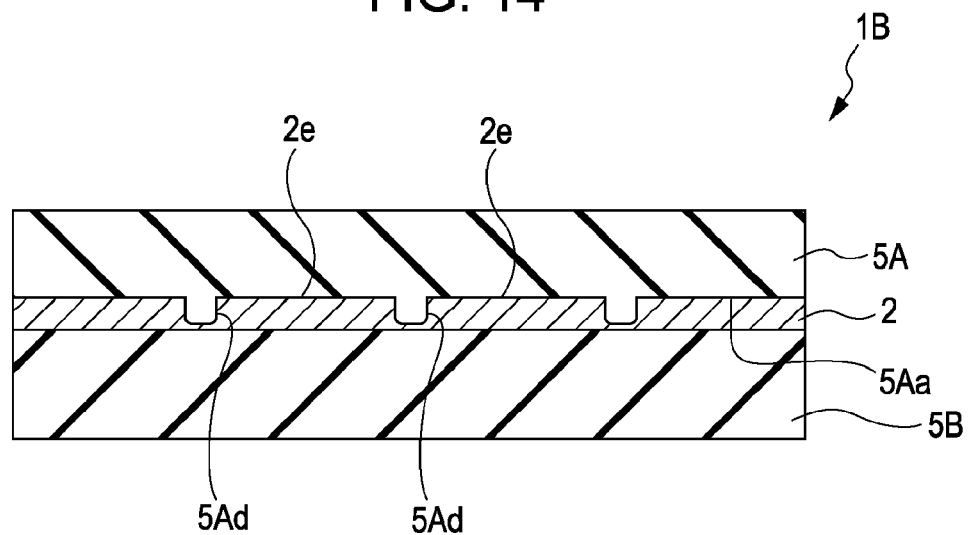
FIG. 14 is a vertical cross-sectional view showing the electromagnetic wave-absorption multilayer substrate according to said another embodiment in which the protrusions are formed on one facing surface.

In addition, in the first embodiment, although the holes 5Ab are formed in the facing surface 5Aa of the insulating substrate 5A, in another embodiment, as shown in FIGS. 13 and 14, protrusions 5Ad may be formed on the facing surface 5Aa of the insulating substrate 5A. When the protrusions 5Ad are formed on the facing surface 5Aa, since irregularities are formed thereon, non-protrusion corresponding portions 2e of the electromagnetic wave-absorption sheet 2 are not easily compressed; as a result, an effect similar to that of the holes 5Ab formed in the facing surface 5Aa can be obtained.

Accordingly, in the case in which the protrusions 5Ad are formed on the facing surface 5Aa, effects obtained when at least two protrusions 5Ad are formed, when the protrusions 5Ad are disposed at regular intervals, when the protrusions 5Ad are disposed in a lattice shape or a staggered lattice shape, when the protrusions 5Ad are formed by press machining, and when the protrusions 5Ad are formed to have a protrusion length of 25 to 440 μm are similar to those obtained in the case in which the holes 5Ab are formed in the facing surface 5Aa. In addition, when the protrusions 5Ad are formed in a linear wall shape having a predetermined width, an effect similar to that shown in FIG. 3, in which the holes 5Ab are disposed at regular intervals while the thickness of the wall portions 5Ac formed in the facing surface 5Aa in the first embodiment is maintained constant, can be obtained; hence, the anti-compression strength of an electromagnetic wave-absorption multilayer substrate 1B can be improved, and in addition, the number of the protrusions 5Ad can be easily increased.

Next, with reference to FIGS. 15 and 16, an electromagnetic wave-absorption multilayer substrate 1C of the second embodiment will be described.

Figure 15:
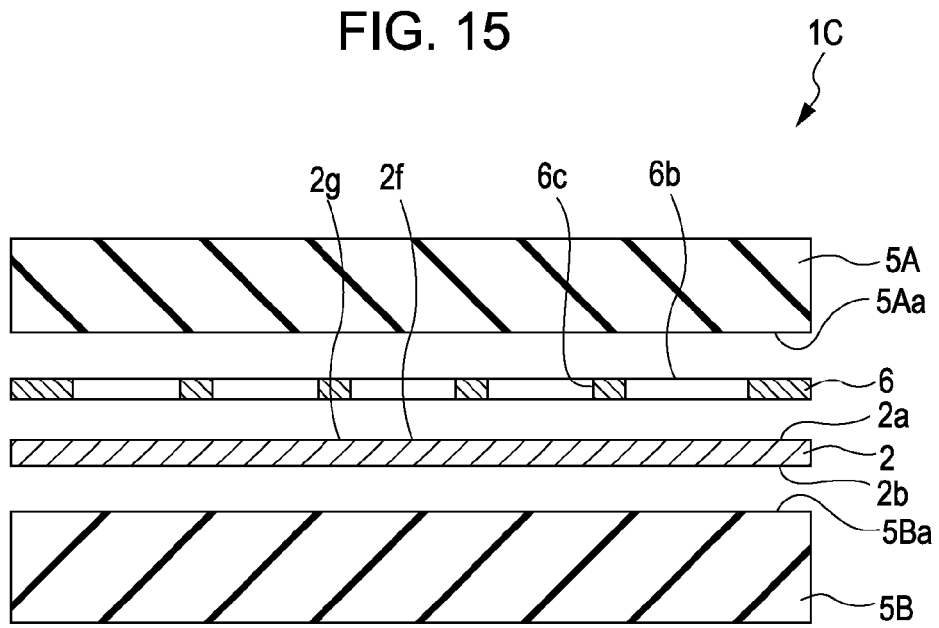
FIG. 15 is an exploded vertical cross-sectional view of an electromagnetic wave-absorption multilayer substrate according to a second embodiment.
Figure 16:
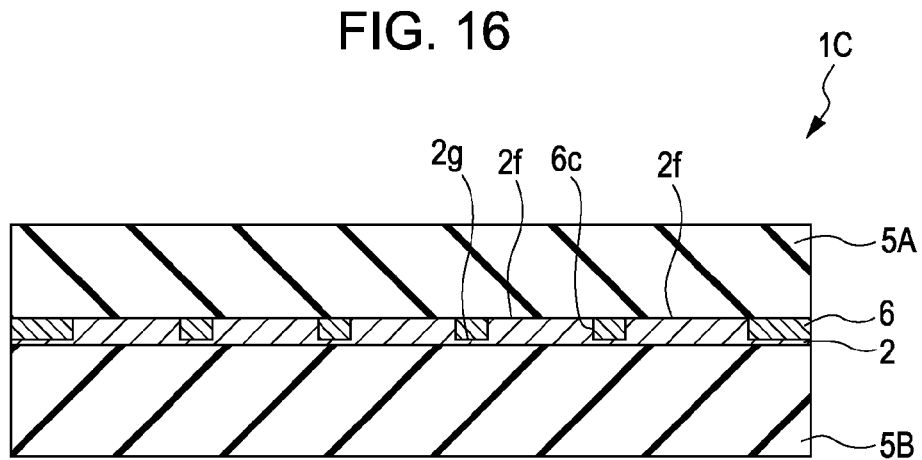
FIG. 16 is a vertical cross-sectional view of the electromagnetic wave-absorption multilayer substrate according to the second embodiment.

FIGS. 15 and 16 show the electromagnetic wave-absorption multilayer substrate 1C of the second embodiment. As shown in FIG. 15, the electromagnetic wave-absorption multilayer substrate 1C of the second embodiment has an electromagnetic wave-absorption sheet 2, two insulating substrates 5A and 5B, and a spacer 6. As the electromagnetic wave-absorption sheet 2, a sheet similar to that used in the first embodiment is used. Although the two insulating substrates 5A and 5B are almost similar to those used in the first embodiment, the holes 5Ab (or the protrusions 5Ad) are not formed in both facing surfaces 5Aa and 5Ba, and the above facing surfaces are formed flat. Instead, the spacer 6 which is not used in the first embodiment is provided between the electromagnetic wave-absorption sheet 2 and the insulating substrate 5A.

As shown in FIG. 15, the spacer 6 is formed using a heat resistant resin or prepregs to have a sheet shape of a uniform thickness, and in addition, at least one penetrating hole 6b is formed in the spacer 6 to face the electromagnetic wave-absorption sheet 2. A material for the spacer 6 is preferably similar or equal to that for the insulating substrates 5A and 5B. This spacer 6 is pressure-bonded to one surface (surface 2a in the second embodiment as shown in FIG. 15) of the electromagnetic wave-absorption sheet 2. When the spacer 6 and the two insulating substrates 5A and 5B are formed using prepregs, the spacer 6 is thermal pressure-bonded to the electromagnetic wave-absorption sheet 2 together with the two insulating substrates 5A and 5B under thermal pressure application conditions of a temperature of 170° C. and a pressure of 50 kg/cm2.

The number of the penetrating holes 6b formed in the spacer 6 is preferably at least two as shown in FIG. 15 as the number of the holes 5Ab formed in the facing surface 5Aa of the first embodiment. The penetrating holes 6b are preferably formed at regular intervals and more preferably disposed in a lattice shape or in a staggered lattice shape.

In addition, the penetrating holes 6b preferably have a rectangular shape and are preferably formed by one-shot press machining. In this step, by adjusting the thickness of the spacer 6, the penetrating hole length of the penetrating hole 6b is preferably set to 25 to 44o μm and more preferably set to 50 to 80 μm.

Next, with reference to the figures, the effect of the electromagnetic wave-absorption multilayer substrate 1C of the second embodiment will be described.

In the electromagnetic wave-absorption multilayer substrate 1C of the second embodiment, as the first embodiment, a metal glass alloy containing an amorphous phase as a primary phase is used for the soft magnetic alloy powder 3. Hence, as the permeability of the electromagnetic wave-absorption sheet 2 increases, the magnetic loss thereof decreases; hence, the electromagnetic wave suppressing effect can be improved.

As shown in FIGS. 15 and 16, in order to insulate and protect the electromagnetic wave-absorption sheet 2, the two insulating substrates 5A and 5B are pressure-bonded from the front surface 2a side and the rear surface 2b side of the electromagnetic wave-absorption sheet 2, respectively. In addition, in the electromagnetic wave-absorption multilayer substrate 1C of the second embodiment, the spacer 6 having at least one penetrating hole 6b is formed between the insulating substrate 5A and the electromagnetic wave-absorption sheet 2. As shown in FIG. 15, since the penetrating holes 6b are formed to face the electromagnetic wave-absorption sheet 2, portions thereof corresponding to the penetrating holes 6b, that is, penetrating-hole corresponding portions 2f, are not easily compressed as compared to the other portions 2g, as shown in FIG. 16. As a result, as the first embodiment, a decrease in the electromagnetic wave absorption rate of the electromagnetic wave-absorption sheet 2 can be prevented.

In addition, when at least two penetrating holes 6b are formed in the spacer 6, as in the case of the holes 5Ab formed in the facing surface 5Aa of the first embodiment, the penetrating holes 6b function as an anti-slipping element for the electromagnetic wave-absorption sheet 2. Hence, when the insulating substrates 5A and 5B are pressure-bonded, the spacer 6 and the insulating substrates 5A and 5B are prevented from slipping in a direction perpendicular to the compression direction. In addition, when at least two penetrating holes 6b are disposed at regular intervals, wall portions 6c formed between the penetrating holes 6b are disposed at regular intervals and function as support portions between the facing surfaces 5Aa and 5Ba. Hence, as the first embodiment, the anti-compression strength of the electromagnetic wave-absorption multilayer substrate 1C can be improved.

In addition, when the penetrating holes 6b are each formed to have a rectangular shape, since the penetrating holes 6b are easily formed at regular intervals, the number of the penetrating holes 6b can be easily increased. In particular, when the penetrating holes 6b are formed in a lattice shape or in a staggered lattice shape, as the number of the penetrating holes 6b is increased, the anti-compression strength of the electromagnetic wave-absorption multilayer substrate 1C can be improved. Since being formed in the spacer 6 by one-shot press machining, the penetrating holes 6b can be easily formed.

In addition, by using the feature in that when the thickness of the electromagnetic wave-absorption sheet 2 is in the range of 25 to 440 μm before the thermal pressure application, the imaginary permeability (magnetic loss) $\mu''$ is 10 or more, when the penetrating hole depth of the penetrating hole 6b is set in the range of 25 to 440 μm, the imaginary permeability $\mu''$ of the electromagnetic wave-absorption multilayer substrate 1C can be made 10 or more as in the case of the first embodiment in which the depth of the hole 5Ab in the facing surface 5Aa is set in the range of 25 to 440 μm.

In addition, when the two insulating substrates 5A and 5B and the spacer 6 having the penetrating holes 6b are formed using prepregs and are pressure-bonded to the electromagnetic wave-absorption sheet 2 while heat is applied thereto, since the prepregs have superior insulating and adhesion properties, the electromagnetic wave-absorption multilayer substrate 1C can be easily adhered to another wiring board while the electromagnetic wave-absorption sheet 2 is insulated from another conductive member. In addition, by using prepregs for forming the spacer 6, the spacer 6 can be prevented from being displaced from the electromagnetic wave-absorption sheet 2.

That is, according to the electromagnetic wave-absorption multilayer substrates of the first and the second embodiments, the decrease in electromagnetic wave absorption rate is prevented by partly preventing the compression of the electromagnetic wave-absorption sheet 2; hence, even when the insulating substrates 5A and 5B are pressure-bonded to the electromagnetic wave-absorption sheet 2, the effect can be obtained in which the electromagnetic wave absorption rate of the electromagnetic wave-absorption sheet 2 before it is incorporated in the electromagnetic wave-absorption multilayer substrate can be maintained.

In addition, the present invention is not limited to the above-described embodiments and, whenever necessary, may be variously changed and/or modified within the scope of the present invention.

What is claimed is:

1. An electromagnetic wave-absorption multilayer substrate comprising:
   an electromagnetic wave-absorption sheet which includes a soft magnetic alloy powder and a binding agent and which has a sheet shape; and
   two insulating substrates which have facing surfaces facing the electromagnetic wave-absorption sheet and which sandwich the electromagnetic wave-absorption sheet and are pressure-bonded thereto,
   wherein at least one of the two insulating substrates has at least one hole formed in the facing surface or at least one protrusion formed on the facing surface such that a portion of the electromagnetic wave-absorption sheet corresponding to the hole or corresponding to non-protrusion is not or less compressed by the insulating substrates compared to other portions of the electromagnetic wave-absorption sheet between the insulating substrates when the insulating substrates are pressure-bonded,
   and wherein said at least one hole has a depth less than a thickness of the insulating substrate and does not penetrate the insulating substrate.

2. The electromagnetic wave-absorption multilayer substrate according to claim 1, wherein the number of the holes or the protrusions is at least two.

3. The electromagnetic wave-absorption multilayer substrate according to claim 1, wherein the holes or the protrusions are disposed at regular intervals.

4. The electromagnetic wave-absorption multilayer substrate according to claim 1, wherein the hole or the protrusion has a rectangular shape or a linear wall shape.

5. The electromagnetic wave-absorption multilayer substrate according to claim 1, wherein the holes or the protrusions are disposed in a lattice shape or a staggered lattice shape.

6. The electromagnetic wave-absorption multilayer substrate according to claim 1, wherein the insulating substrates are formed of prepregs and are thermal pressure-bonded to the electromagnetic wave-absorption sheet.

7. The electromagnetic wave-absorption multilayer substrate according to claim 1, wherein the hole or the protrusion is formed by press machining.

8. The electromagnetic wave-absorption multilayer substrate according to claim 1, wherein the soft magnetic alloy powder comprises a metal glass alloy containing an amorphous phase as a primary phase.

9. The electromagnetic wave-absorption multilayer substrate according to claim 1, wherein the hole or the protrusion has a hole depth or a protrusion length of 25 to 440 μm.

* * * * *